(12) United States Patent
Wang

(10) Patent No.: US 7,274,258 B2
(45) Date of Patent: Sep. 25, 2007

(54) DYNAMIC BIAS CIRCUIT FOR A RADIO-FREQUENCY AMPLIFIER

(75) Inventor: Chih Wei Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 118 days.

(21) Appl. No.: 11/222,400

(22) Filed: Sep. 8, 2005

(65) Prior Publication Data

US 2007/0052479 A1   Mar. 8, 2007

(51) Int. Cl.
   *H03G 3/10*    (2006.01)
(52) U.S. Cl. ...................................... 330/285; 330/296
(58) Field of Classification Search ................. 330/85, 330/96, 302
   See application file for complete search history.

(56) References Cited

U.S. PATENT DOCUMENTS

| | | | |
|---|---|---|---|
| 6,300,837 B1 | 10/2001 | Sowlati et al. | 330/296 |
| 6,414,553 B1 | 7/2002 | Luo | 330/296 |
| 6,492,875 B2 | 12/2002 | Luo et al. | 330/296 |
| 6,690,237 B2 * | 2/2004 | Miyazawa | 330/285 |
| 6,791,418 B2 | 9/2004 | Luo et al. | 330/296 |
| 6,806,774 B2 * | 10/2004 | Sakuno | 330/296 |
| 6,806,775 B2 * | 10/2004 | Abe | 330/297 |
| 6,819,180 B2 | 11/2004 | Krvavac | 330/285 |
| 7,009,453 B2 * | 3/2006 | Kuriyama | 330/289 |

* cited by examiner

*Primary Examiner*—Henry Choe

(57) ABSTRACT

A dynamic bias circuit for an RF amplifier is provided to overcome the drawbacks of conventional bias circuits. The dynamic bias circuit of the present invention is best used for an RF amplifier having an FET amplifying transistor. It automatically raises the DC bias point as the input power increases. As a result, the saturation of output power in the pinch-off region can be avoided. This dynamic bias circuit not only improves the operating characteristics of the RF amplifier, such as high operating efficiency and high-linearity output power, but also consumes zero power in its internal circuitry. Furthermore, it has a simple circuit structure with very few circuit components and a reduced chip area. It can thus be easily integrated into an amplifier to achieve a cost reduction.

8 Claims, 10 Drawing Sheets

DYNAMIC BIAS CIRCUIT FOR A RADIO-FREQUENCY AMPLIFIER

FIELD OF THE INVENTION

The present invention generally relates to a bias circuit for an amplifier, especially to a dynamic bias circuit for a radio-frequency (RF) amplifier.

BACKGROUND OF THE INVENTION

RF amplifiers, including low-noise amplifiers (LNAs) and power amplifiers (PAs), are very crucial components in a wireless communication system. In a receiver, an RF signal received from an antenna passes a filter and then immediately encounters an LNA. Therefore, the linearity of the LNA significantly affects the dynamic range of the receiver. PAs are used to enhance the output powers of transmitters. A PA is supposed to have high operating efficiency and provide high-linearity output power to meet system requirements without dissipating significant power.

In order to reduce the power dissipation, an RF amplifier in a wireless communication system often uses a DC bias point (quiescent operating point) operated in the class AB mode. This is especially true for a power amplifier which is usually the most power-hungry element in a transmitter. The power added efficiency (PAE) of a PA directly affects how long a battery can last. A DC bias in the class AB operation can improve the PAE of a PA due to its low quiescent bias current. However, the load line of an amplifier operated in the class AB mode may run into a pinch-off region and result in a gain compression when the output power of the amplifier increases to a certain level. Said gain compression then leads to a saturation of the output power because the DC operating point of the class AB amplifier approaches the pinch-off region. As a result, the power gain of a class AB amplifier may be limited by the pinch-off region when the output power increases to a certain level.

To prevent the aforementioned gain compression phenomenon from happening, the quiescent bias current can be increased to ensure the amplifier operating in the desired mode. However, the increase of the quiescent bias current also leads to an extra DC power consumption at low power levels. The side effect of the extra DC power consumption is a PAE reduction.

FIG. 1 shows a conventional dynamic bias circuit for a PA disclosed in the U.S. Pat. No. 6,300,837. The bias circuit is suitable for a PA having a bipolar amplifying transistor, such as GaAs HBT or SiGe HBT or Si BJT. The amplifier can be operated in the class B or class AB mode. This bias circuit can enhance the maximum output power of an amplifier, and reduce DC power dissipation at low output power levels. It supplies a DC bias current to the base electrode of an amplifying transistor. In the bias circuit, there is a built-in power sensing circuit which acts as a current control current source or voltage control current source. As the input power increases, the power sensing circuit forces the bias circuit to produce more bias current. Therefore, the bias current supplied by the dynamic bias circuit increases with increasing input power level.

Referring to FIG. 1, the operation principle of a dynamic bias circuit is described in the following. Transistors 142 and 100 are the first and the second amplifying transistors. Both of them are operated in the class AB mode. Transistor 148, a power-sensing transistor, is also operated in the class AB mode. Collector current I1 of the power-sensing transistor 148, which flows into a current mirror 150, increases as the input power increases. The increase of collector current I1 results in an increase of output current I2 of current mirror 150, and hence the current flowing through a bias circuit 120 increases. This leads to an increase of base current I3 of transistor 123. I4 is the base current of the second amplifying transistor 100, which is about equal to $(1+\beta) \times I3$, wherein $\beta$ is the current gain of transistor 123. As can be seen from FIG. 1, I4 is the sum of the quiescent bias current used to control the second amplifying transistor 100 and the current contributed from power-sensing transistor 148. Therefore, the large-signal output power of the second amplifying transistor 100 is enhanced when the input power increases.

Though the aforementioned prior art improves maximum output power as well as power dissipation at low output power levels, it still consumes significant power due to the use of a bipolar amplifying transistors in the PA. The use of a bipolar amplifying transistor inevitably produces a non-zero quiescent bias current flowing through the bias circuit. As a result, it contributes to extra power dissipation. Moreover, it has a complex bias circuit and thus a high manufacturing cost There are more conventional dynamic bias boosting circuits for PAs disclosed in U.S. Pat. Nos. 6,414,553, 6,492,875, and 6,791,418. All these bias boosting circuits use one or more bipolar transistors, and have the same power dissipation problem resulted from the non-zero quiescent bias current.

The bias circuit for a conventional amplifier usually operates at a fixed DC bias voltage. In the case of an amplifier having a field effect transistor (FET) amplifying transistor, the bias circuit provides a fixed DC bias voltage to the gate electrode of the FET. This DC bias voltage does not change with the input or output power. The DC quiescent bias provided by the bias circuit determines whether the amplifier is operated in the class A or class AB mode. In U.S. Pat. No. 6,819,180, an adaptive bias control circuit is disclosed for an RF power amplifier having a lateral double-diffused metal-oxide semiconductor (LDMOS) FET as an amplifying transistor. Said adaptive bias control circuit comprises a second FET transistor whose gate and drain are connected together, and its source is coupled to a fixed voltage. This circuit connection causes the second FET transistor in the bias circuit to constantly draw current, and thus leads to extra power dissipation. Moreover, the DC bias voltage to the gate of the amplifying transistor decreases with increasing input power. This results in an undesirable power gain reduction.

Therefore, there exists a need for a power efficient and cost effective bias circuit to dynamically control the bias point of an RF amplifier for the purpose of improving the linearity of transfer characteristics and reducing power dissipation.

SUMMARY OF THE INVENTION

In the present invention, a dynamic bias circuit for an RF amplifier is provided to overcome the drawbacks of the aforementioned conventional bias circuits. This dynamic bias circuit not only improves the operating characteristics of an RF amplifier, such as high operating efficiency and high-linearity output power, but also consumes zero power in its internal circuitry. Furthermore, it has a simple circuit structure with very few circuit components and a reduced area. It can thus be easily integrated into an amplifier, and a cost reduction is achieved.

This dynamic bias circuit is used for an RF amplifier having an FET amplifying transistor. To overcome the drawback of a fixed bias point (i.e., bias point doesn't change with input power level) provided by conventional bias circuits for FET amplifying transistors, the dynamic bias circuit of the present invention is designed in a way that automatically raises the DC bias point as the input power increases. This prevents the load line from running into the pinch-off region when the input power increases. As a result, the gain compression resulted from the restriction of the load-line in the pinch-off region can be avoided. While the input power decreases, the bias circuit stays at a low DC bias point to reduce power dissipation.

Accordingly, the dynamic bias circuit of the present invention mainly comprises an active device having the same I-V characteristics as a diode, a DC voltage source having one of its two terminals grounded, and a coupling device used to control the magnitude of the leaked signal that is coupled to an input signal received by the RF amplifier. The dynamic bias circuit can be driven by the leaked signal and it can generate an increase of DC voltage versus the input signal.

In a first embodiment of the invention, the dynamic bias circuit comprises an NPN bipolar transistor having its base electrode and collector electrode electrically connected together, a resistor, and a voltage source.

In a second embodiment of the invention, the dynamic bias circuit comprises a diode, a coupling device, and a voltage source. The active device in the dynamic bias circuit is diode instead of an NPN bipolar transistor.

In a third embodiment of the invention, the dynamic bias circuit comprises a diode, a coupling device, a voltage source, and a capacitor.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
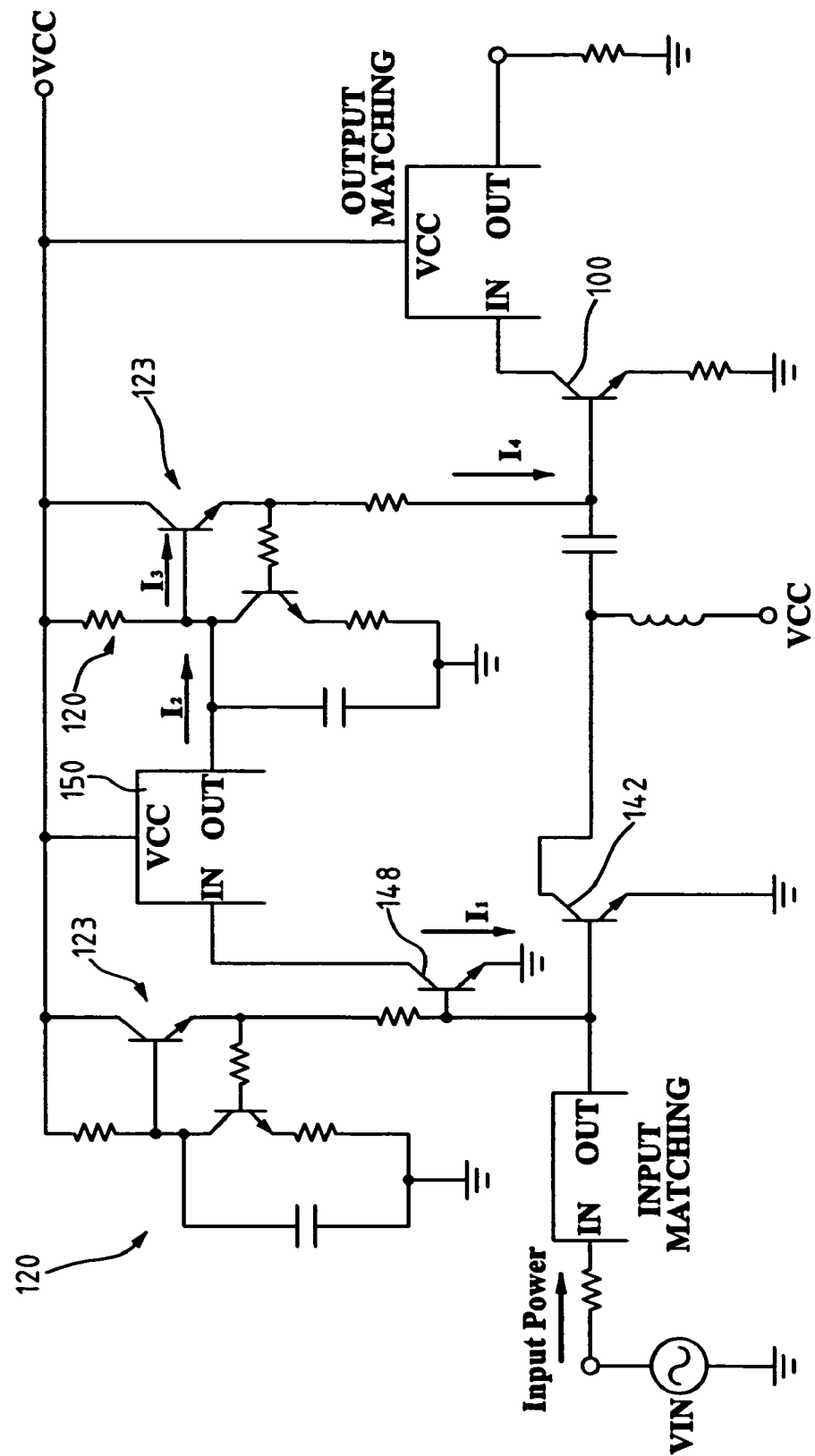
FIG. 1 shows a conventional dynamic bias circuit for a power amplifier.
Figure 2:
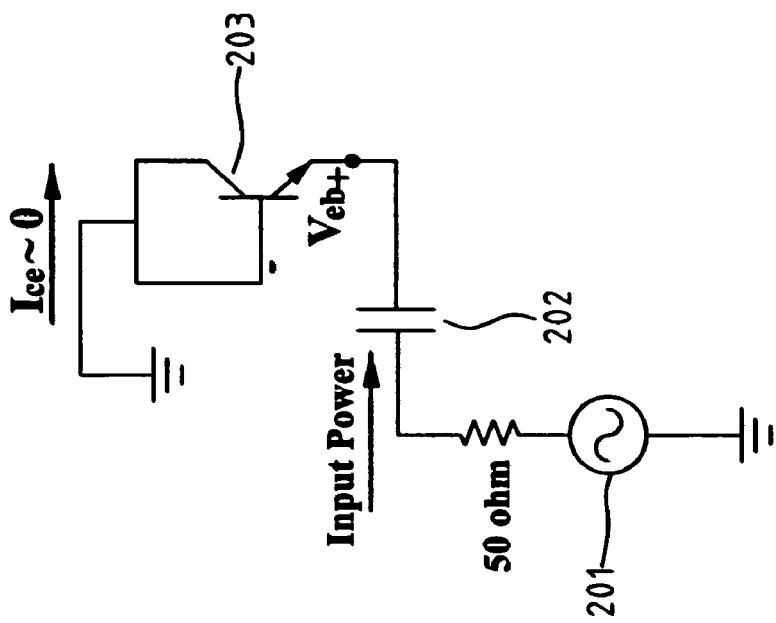
FIG. 2 shows a simplified dynamic bias circuit for an RF amplifier with addition of a simulated signal source and a DC blocking capacitance according to the present invention.
Figure 3:
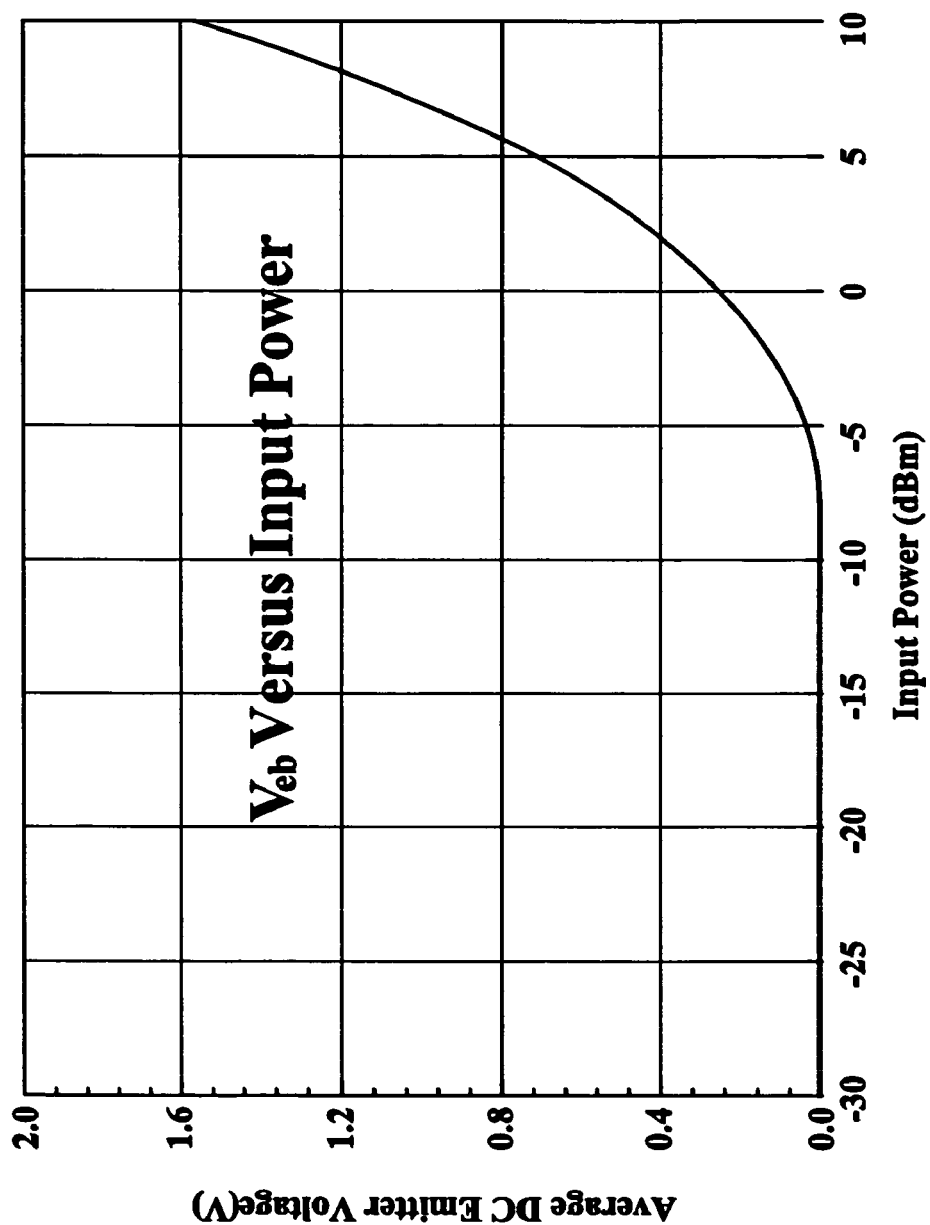
FIG. 3 shows the average DC emitter voltage as a function of input power for the dynamic bias circuit shown in FIG. 2.

According to the present invention, FIG. 2 shows a simplified dynamic bias circuit for an RF amplifier with addition of a simulated signal source 201 and a DC blocking capacitance 202. The dynamic bias circuit comprises only an NPN bipolar transistor 203. The base and collector of transistor 203 are connected together to the ground. Therefore, it electrically behaves like a diode. The DC blocking capacitance 202 is connected between the emitter of transistor 203 and simulated signal source 201. As a result, the DC current flowing through the dynamic bias circuit is forced to zero. A sinusoidal input signal generated by signal source 201 will pass the DC blocking capacitance 202 and travel to the emitter of transistor 203. As the input power increases, so does the DC voltage $V_{eb}$. This means that transistor 203 generates a rectified signal which causes the DC voltage $V_{eb}$ to be controlled as a function of the input power. As can be seen from FIG. 3, the average DC emitter voltage of transistor 203 increases with increasing input power since the base of transistor 203 is grounded.

Figure 4:
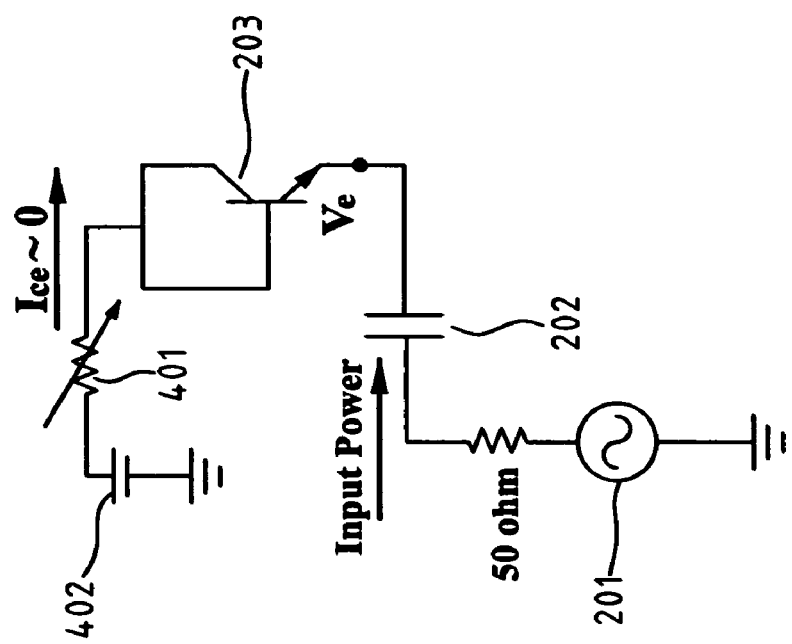
FIG. 4 shows a practical dynamic bias circuit for an RF amplifier with addition of a simulated signal source and a DC blocking capacitance according to the present invention.
Figure 5:
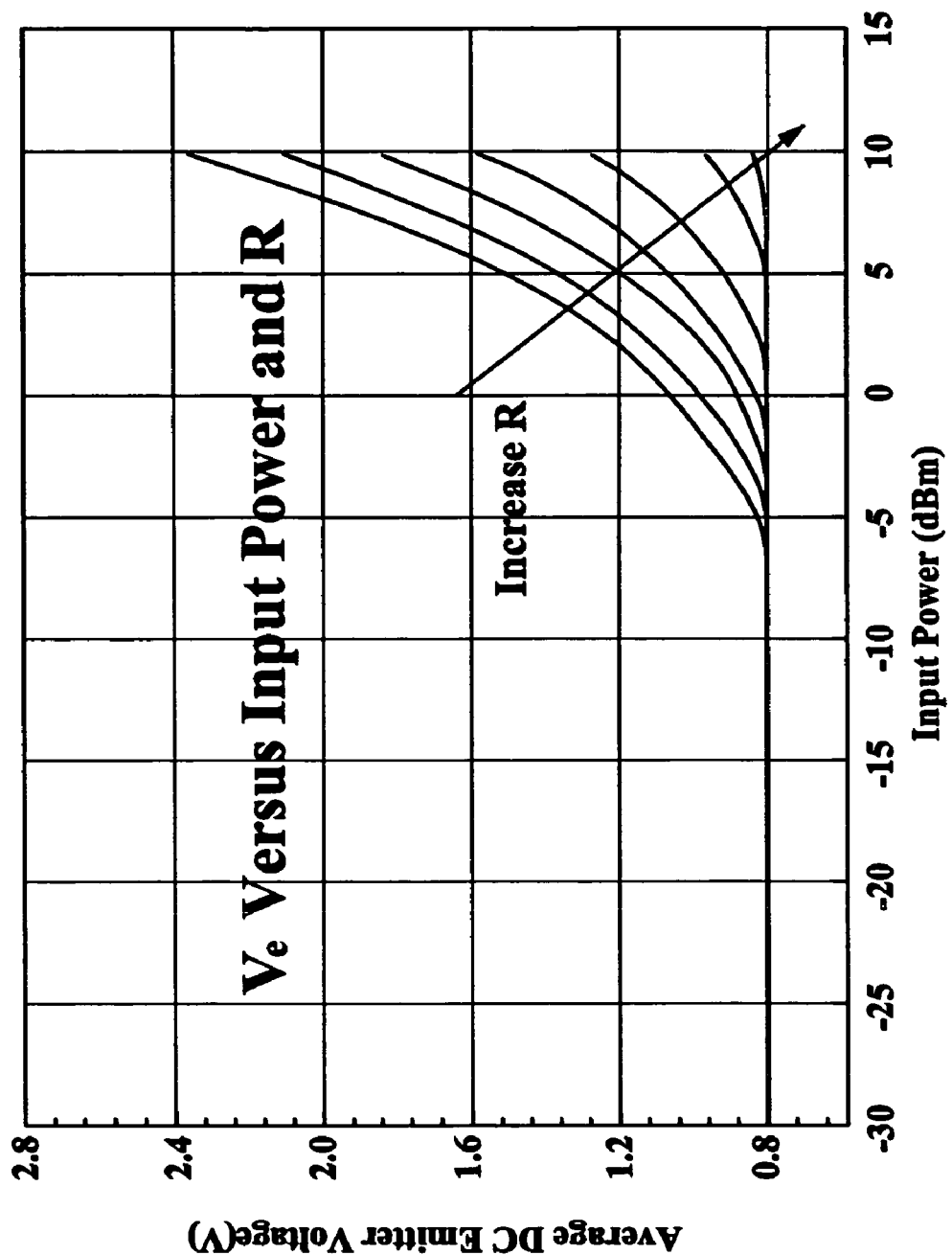
FIG. 5 shows the average DC emitter voltage as a function of input power and resistance R of a variable resistor for the dynamic bias circuit shown in FIG. 4.

FIG. 4 shows a practical dynamic bias circuit for an RF amplifier with addition of the simulated signal source 201 and the DC blocking capacitance 202 according to the present invention. The dynamic bias circuit comprises the NPN bipolar transistor 203, a variable resistor 401 having a resistance of R, and a DC voltage source 402 supplying a voltage of $V_{DC}$. Comparing to FIG. 2, the dynamic bias circuit shown in FIG. 4 further includes one more variable resistor 401 and one more voltage source 402. When the input power is small, the average DC emitter voltage $V_e$ is equal to $V_{DC}$ since the current flowing through the dynamic bias circuit is forced to zero. When the input power increases to a certain level, $V_e$ starts to increase with increasing input power and may even become larger than $V_{DC}$. FIG. 5 shows the average DC emitter voltage as a function of input power and resistance R of variable resistor 401 for the dynamic bias circuit shown in FIG. 4. The curve of an increase of the average DC emitter voltage versus the input power can be controlled by adjusting the resistance R of variable resistor 401. Biasing the gate of an amplifying FET transistor with $V_e$ can improve the linearity of the transfer characteristics. The increase of $V_e$ with input power can prevent the output power from saturation. As the input power decreases, $V_e$ decreases and then stays at a low DC bias voltage in order to reduce power dissipation. Furthermore, the DC current isolated characteristic of the gate of an amplifying FET transistor meets the requirement that the current flowing through the bias circuit is forced to zero.

The dynamic bias circuit of the present invention is suitable for an RF amplifier having an FET amplifying transistor. It can be implemented in several ways. Except for special cases, an amplifying transistor is usually made of an n-type transistor due to its higher carrier mobility than a p-type transistor. Therefore, the following embodiments of the present invention use n-type FET transistors as amplifying transistors. However, the applications of the present invention shall not be limited to n-type amplifying transistors.

Figure 6:
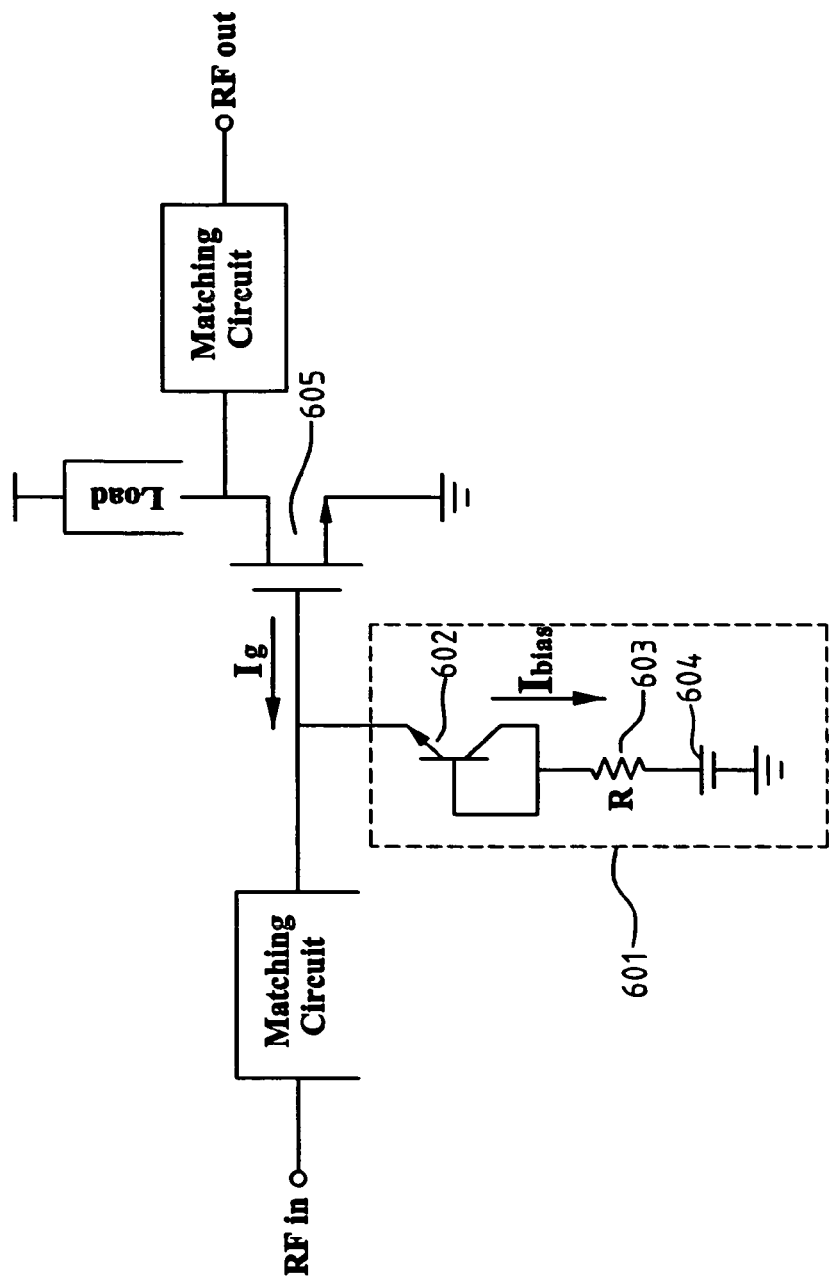
FIG. 6 shows an RF amplifier with a dynamic bias circuit according to a first embodiment of the present invention.

FIG. 6 shows an RF amplifier with a dynamic bias circuit 601 according to a first embodiment of the present invention. Dynamic bias circuit 601 comprises an NPN bipolar transistor 602 having its base electrode and collector electrode electrically connected together, a resistor 603 having a resistance of R, and a voltage source 604 having a voltage of $V_{bias}$. One side of resistor 603 is electrically connected to the base and collector electrodes of bipolar transistor 602, and the other side to voltage source 604. The emitter of bipolar transistor 602 is electrically connected to the gate of an FET amplifying transistor 605. As an RF signal is received from the input port (i.e., RF in), a portion of the input power is coupled to dynamic bias circuit 601 through the emitter of bipolar transistor 602. The magnitude of said portion of the input power is a function of the resistance R of resistor 603.

Figure 7A:
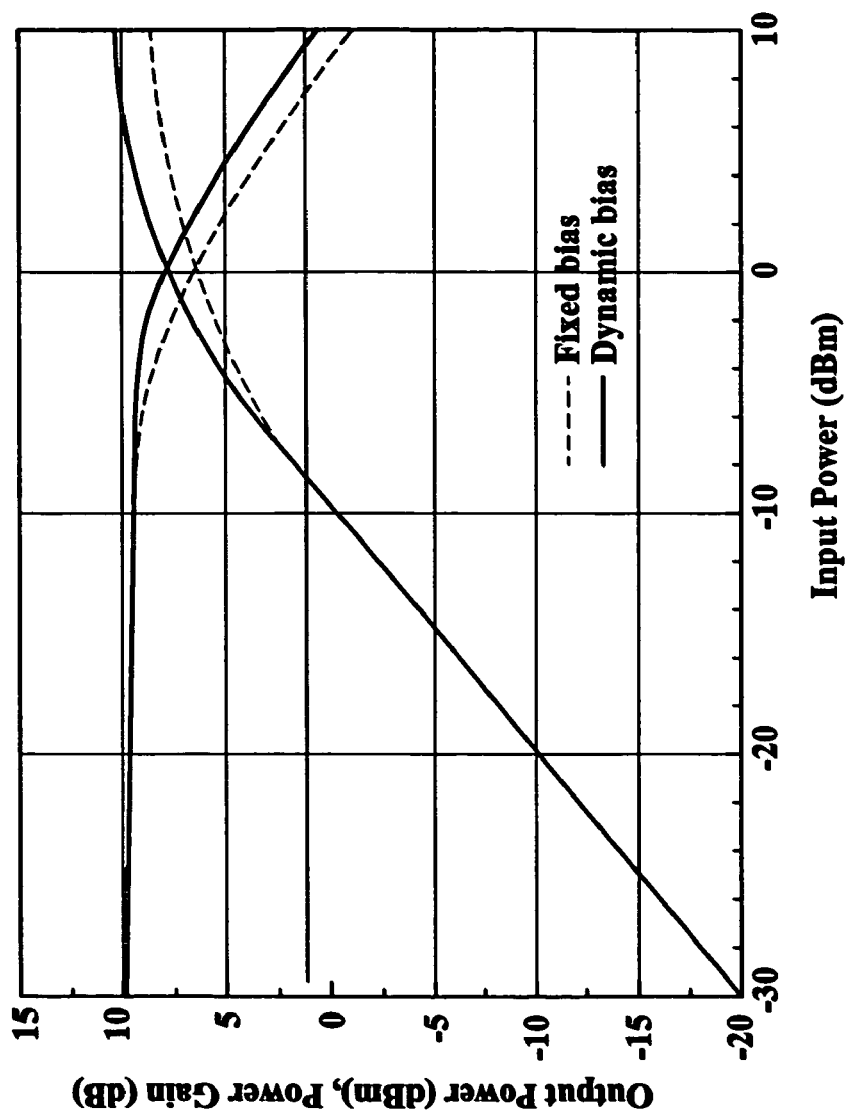
FIG. 7A shows the output powers and the power gains of RF amplifiers as a function of input power for a dynamic bias circuit shown in FIG. 6 and a conventional fixed bias circuit.
Figure 7B:
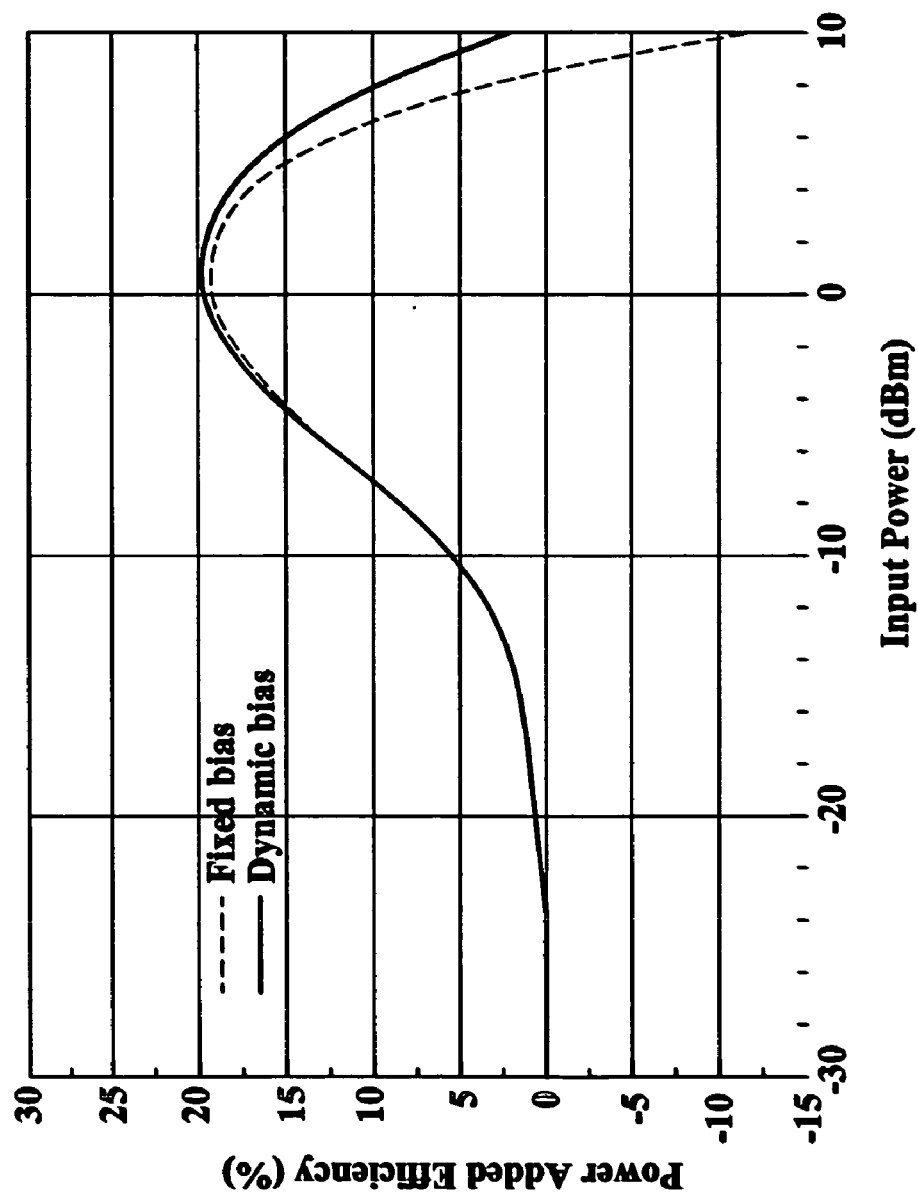
FIG. 7B shows the PAEs of RF amplifiers as a function of input power for a dynamic bias circuit shown in FIG. 6 and a conventional fixed bias circuit.

Simulations have been performed to compare the performance of two different RF amplifiers having dynamic bias circuit 601 and a conventional fixed bias circuit, respectively. A comparison of the output power and the power gain as a function of input power is shown in FIG. 7A. Dynamic bias circuit 601 of the present invention has higher output powers and a better 1 dB compression point than the conventional fixed bias circuit. FIG. 7B shows the PAEs of RF amplifiers as a function of input power for a dynamic bias circuit shown in FIG. 6 and a conventional fixed bias circuit. As can be seen, dynamic bias circuit 601 of the present invention has higher PAEs than the conventional fixed bias circuit though the DC current of the RF amplifier is enlarged during a large-signal operation.

Figure 8:
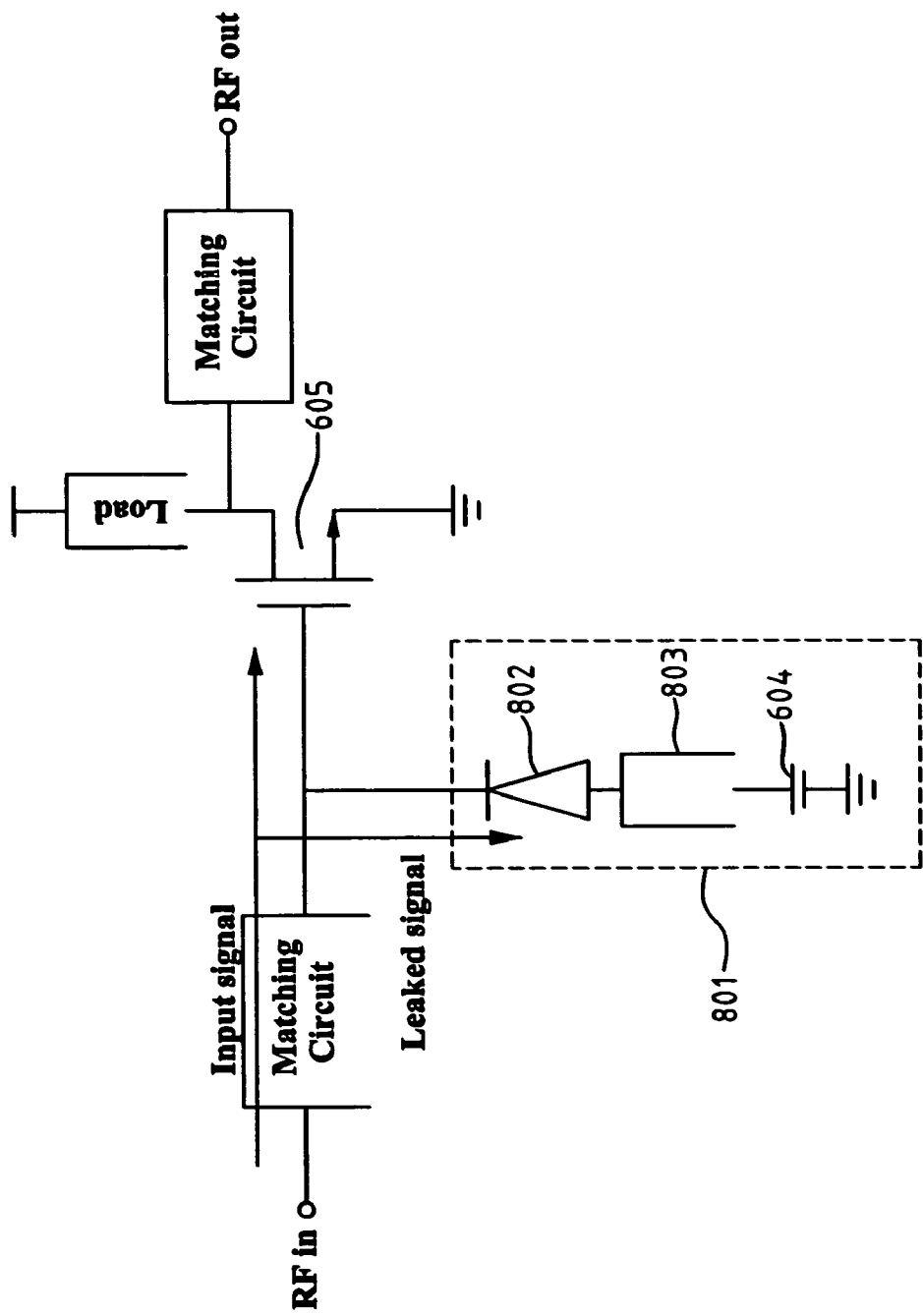
FIG. 8 shows an RF amplifier with a dynamic bias circuit according to a second embodiment of the present invention.

FIG. 8 shows an RF amplifier with a dynamic bias circuit 801 according to a second embodiment of the present invention. Dynamic bias circuit 801 comprises a diode 802, a coupling device 803, and a voltage source 604. The active device in dynamic bias circuit 801 is diode 802 instead of an NPN bipolar transistor shown in FIG. 6. Said active device can be any transistor that is configured in a way to electrically behave like a diode in terms of I-V characteristics. For example, a three-terminal bipolar transistor can have its base electrode and collector electrode electrically connected together to form a two-terminal diode. The cathode of diode 802 is connected to the gate of amplifying transistor 605, and its anode is connected with coupling device 803. The other side of coupling device 803 is then connected to voltage source 604. Coupling device 803 is used to control the magnitude of a leaked signal that is coupled to the input signal received by the RF amplifier, and subsequently the leaked signal drives the dynamic bias circuit 801. In the first embodiment of the present invention stated above, its coupling device is a resistor.

Figure 9:
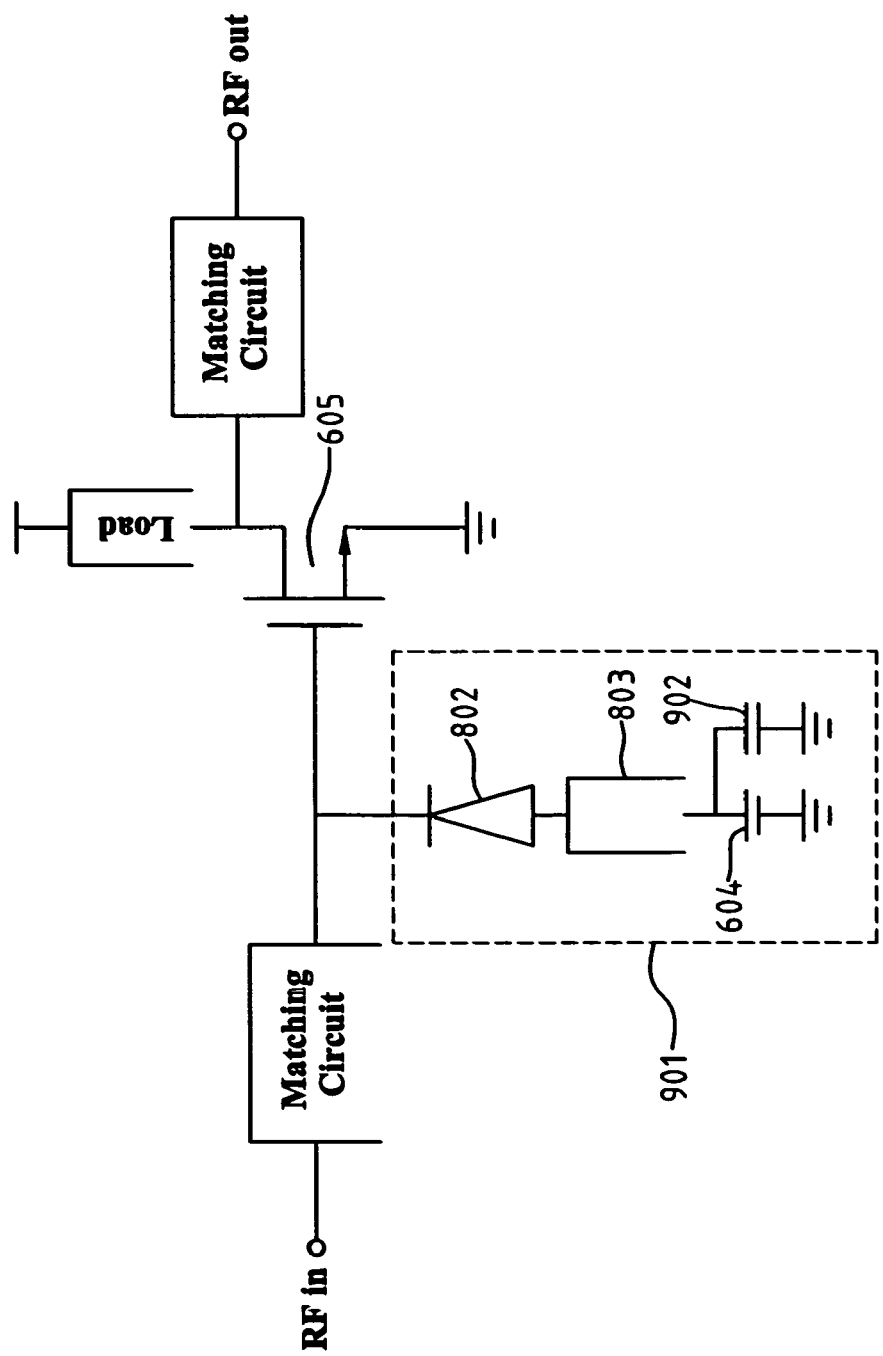
FIG. 9 shows an RF amplifier with a dynamic bias circuit according to a third embodiment of the present invention.

FIG. 9 shows an RF amplifier with a dynamic bias circuit 901 according to a third embodiment of the present invention. Dynamic bias circuit 901 comprises a diode 802, a coupling device 803, a voltage source 604, and a capacitor 902. Considering that voltage source 604 may not provide a perfect enough ground connection for high-frequency signals, capacitor 902 is connected between coupling device 803 and the ground terminal as a ground path for high-frequency signals. A conventional capacitor often occupies a very significant chip area of an IC chip. Therefore, capacitor 902 may be replaced with a metal-oxide semiconductor (MOS) device having a capacitive characteristic to save space.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A bias circuit for use with a radio-frequency (RF) amplifier having an amplifying transistor, said bias circuit dynamically adjusting its DC output voltage based on the power of an input signal received by said RF amplifier and changing the operation current of said RF amplifier, said RF amplifier having an input port and an output port, said input port being for receiving said input signal and said output port being for transmitting an amplified signal, an output terminal of said bias circuit being connected to said input port of said RF amplifier, said input port of said RF amplifier being a controlling electrode of said amplifying transistor, and said bias circuit comprising:
   an active device having the same I-V characteristics as a diode, wherein a cathode of said active device is said output terminal of said bias circuit and is connected to said controlling electrode of said amplifying transistor;
   a DC voltage source having one of its two terminals grounded; and
   a coupling device used to control the magnitude of a leaked signal that is coupled to said input signal, and said bias circuit being driven by said leaked signal and drawing no DC operating current;
   wherein a first side of said coupling device is connected to an anode of said active device, and a second side of said coupling device is connected to the ungrounded terminal of said DC voltage source.

2. The bias circuit as claimed in claim 1, wherein said amplifying transistor is a field-effect-transistor (FET) and said controlling electrode is the gate electrode of said FET.

3. The bias circuit as claimed in claim 1, wherein said active device is a diode.

4. The bias circuit as claimed in claim 1, wherein said active device is a bipolar transistor having its base electrode and collector electrode electrically connected together.

5. The bias circuit as claimed in claim 1, wherein said active device is an FET transistor having its gate electrode and drain electrode electrically connected together.

6. The bias circuit as claimed in claim 1, wherein said bias circuit further comprises a capacitor, said capacitor is connected between said coupling device and a ground terminal as a ground path for high-frequency signals.

7. A bias circuit for use with a radio-frequency (RF) amplifier having an amplifying transistor, said bias circuit dynamically adjusting its DC output voltage based on the power of an input signal received by said RF amplifier and changing the operation current of said RF amplifier, said RF amplifier having an input port and an output port, said input port being for receiving said input signal and said output port being for transmitting an amplified signal, an output terminal of said bias circuit being connected to said input port of said RF amplifier, said input port of said RF amplifier being a controlling electrode of said amplifying transistor, and said bias circuit comprising:
   an active device having the same I-V characteristics as a diode, wherein a cathode of said active device is said output terminal of said bias circuit and is connected to said controlling electrode of said amplifying transistor;
   a DC voltage source having one of its two terminals grounded;
   a coupling device used to control the magnitude of a leaked signal that is coupled to said input signal, and said bias circuit being driven by said leaked signal; and
   a capacitor connected between said coupling device and a ground terminal as a ground path for high frequency signals;
   wherein a first side of said coupling device is connected to an anode of said active device, and a second side of said coupling device is connected to the ungrounded terminal of said DC voltage source.

8. The bias circuit as claimed in claim 7, wherein said capacitor is a metal-oxide semiconductor (MOS) capacitor having a capacitive characteristic to save chip area.

* * * * *